(12) United States Patent
Weng et al.

(10) Patent No.: US 7,042,057 B2
(45) Date of Patent: May 9, 2006

(54) PROCESS FOR CREATING METAL-INSULATOR-METAL DEVICES

(75) Inventors: Jian-gang Weng, Corvallis, OR (US); Peter Mardilovich, Corvallis, OR (US); John C. Rudin, Bristal (GB); Adrian Geisow, Portihead (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/122,910

(22) Filed: May 5, 2005

(65) Prior Publication Data

US 2005/0202647 A1    Sep. 15, 2005

Related U.S. Application Data

(63) Continuation of application No. 10/797,260, filed on Mar. 9, 2004, now Pat. No. 6,967,118.

(51) Int. Cl.
*H01L 31/0232* (2006.01)

(52) U.S. Cl. .................................. 257/432; 257/431
(58) Field of Classification Search ................. 438/29, 438/30, 38, 98; 257/432, 431
See application file for complete search history.

(56) References Cited

U.S. PATENT DOCUMENTS 6,243,062 B1 *   6/2001   den Boer et al. ............. 345/91
2002/0093601 A1 *   7/2002   Inoue et al. ................... 349/49

* cited by examiner

*Primary Examiner*—Caridad Everhart

(57) ABSTRACT

A process is described for fabricating an active addressing component such as a metal-insulator-metal (MIM) device by creating surface relief levels to form trenches, and depositing a metal in the trenches. The metal is anodized to create a non-linear dielectric. A second metal is deposited in the trenches to create an electrical with the dielectric which a contact is provided, and transferring the MIM device to a substrate by adhesive transfer.

9 Claims, 15 Drawing Sheets

PROCESS FOR CREATING METAL-INSULATOR-METAL DEVICES

This application is a Continuation of U.S. application Ser. No. 10/797,260, filed Mar. 9, 2004 now U.S. Pat. No. 6,967,118, the specification of which is incorporated herein by reference.

BACKGROUND

Active matrix liquid crystal displays (AMLCD) are formed from an addressing matrix (i.e., an active matrix) and an electro-optically responsive layer that includes multiple liquid crystal cells (i.e., a liquid crystal layer). The addressing matrix includes active devices which are addressed by external addressing lines connected to driver electronics. An active device is associated with one or more local electrodes providing an electrical field to act upon the liquid crystal (LC) layer. Typically a particular active device is associated with a picture element or pixel in the AMLCD. The active matrix separates the addressing of the pixels from an electro-optical response of the LC layer. An electrical field on a pixel set by an active device and suitable switching waveforms provide a desired optical output such as a grayscale shade, etc.

Two types of active devices may be used in AMLCD. One is a three-terminal device such as a Thin Film Transistor (TFT) device, and another is two-terminal device such as a Metal-Insulator-Metal (MIM) device. Each type has their advantages and disadvantages. In general, TFT devices make use of rigid substrates (i.e., glass substrates) and silicon processing to form the active devices. Typically silicon processes are best effected at relatively high temperatures (i.e., greater than 300° C.). Furthermore, since the complete addressing active matrix is formed on one substrate, and the device itself is complex, several aligned lithographic processes may be needed (e.g., more than four processes). This requires the use of a dimensionally stable, high temperature substrate such as glass, rather than a low temperature dimensionally unstable polymer based substrate.

MIM devices rely on non-linear behavior of certain dielectrics (e.g. oxides such as tantalum oxide or $Ta_2O_5$), which may be formed at low temperatures (i.e., less than 200° C.). An addressing matrix is formed on both front plane and back plane of a display. Therefore, in general MIM devices are simpler to manufacture than a TFT device, since there are fewer process (i.e., less than four aligned lithographic processes).

It may be advantageous for large area applications to form a display from plastic substrates, rather than thin glass substrates that are typically used. The use of plastic substrates may limit upper process temperatures and limit the number of aligned lithographic processes due to the dimensional instability of a plastic substrate. Therefore, when using plastic substrates, MIM devices may be preferred over TFT devices.

A MIM device may functionally behave like a capacitor having a non-linear current/voltage (I/V) characteristic. In other words, current does not flow up until a threshold voltage is exceeded, after which the MIM device presents relatively low impedance. The threshold voltage is observed in both applied polarities, and often the MIM device is modeled as a capacitor in parallel with a pair of diodes in a "back to back" arrangement.

A single MIM device in series with the addressed liquid crystal pixel has an effect on a charge blocking device, such that once a pixel voltage corresponding to a desired optical output has been achieved, further charge is not passed to or from the pixel and that optical state is held until the pixel is next addressed.

Due to the non-symmetric nature of the interfaces between the insulator and the metal contacts, the forward and reverse threshold voltages may be different. In the single MIM case, this may lead to liquid crystal cell polarization and an effect known as "image sticking". To overcome the "image sticking" effect, it is well known in the art to use two MIM devices in "anti-series" fashion. The two MIM devices are typically referred to as a "dual-MIM" device. The dual-MIM device arrangement provides an ability to cancel out forward bias effects of one MIM device with reverse bias effects of the other MIM device, and also reduces the capacitive coupling of the aggregate dual-MIM device. One disadvantage is that the maximum current is reduced and the overall threshold may be increased. Furthermore, the additional complexity of the matrix may affect the overall manufacturing yield.

Traditionally MIM devices are formed by deposition, photo-lithography, material conversion and etching in a largely subtractive manner on the surface of the final display substrate. The processes applied are thus limited by the substrate material and the deleterious effect of the protrusion and non-planarity of the resulting structure into the display cell on the liquid crystal electro-optical effect.

Accordingly, the need exists for new and improved systems and methods to fabricate MIM devices or active addressing elements for use in AMLCD.

SUMMARY

A process is described for fabricating an active addressing component such as a metal-insulator-metal (MIM) device by creating surface relief levels to form trenches, and depositing a metal in the trenches. The metal is anodized to create a non-linear dielectric. A second metal is deposited in the trenches to create an electrical with the dielectric which a contact is provided, and transferring the MIM device to a substrate by adhesive transfer.

BRIEF DESCRIPTION OF THE DRAWINGS

The following detailed description refers to the accompanying figures. In the figures, the left-most digit(s) of a reference number identifies the figure (Fig.) in which the reference number first appears. Moreover, the same reference numbers are used throughout the drawings to reference like features and components.

FIG. 2 is a cross section diagram illustrating initial layers being applied in the fabrication of a MIM device.

FIG. 3 is a cross section diagram illustrating embossing in the fabrication of a MIM device.

FIG. 4 is a cross section diagram illustrating removal of an embossing shim in the fabrication of a MIM device.

FIG. 5 is a cross section diagram illustrating exposing a conductive carrier in the fabrication of a MIM device.

FIG. 6 is a cross section diagram illustrating deposition of a metal in the fabrication of a MIM device.

FIG. 7 is a cross section diagram illustrating selective anodization in the fabrication of MIM device.

FIG. 8 is a cross section diagram illustrating removal of excess metal in the fabrication of MIM device.

FIG. 9 is a cross section diagram illustrating reduction of a surface layer in the fabrication of MIM device.

FIG. 10 is a cross section diagram illustrating a secondary anodization in the fabrication of MIM device.

FIG. 11 is a cross section diagram illustrating a secondary deposition of a metal in the fabrication of MIM device.

FIG. 12 is a cross section diagram illustrating lamination of a final substrate in the fabrication of MIM device.

FIG. 13 is a plan view diagram illustrating a MIM device.

FIG. 14 is a cross section diagram illustrating a display configuration with a MIM device.

FIG. 15 is a schematic diagram illustrating an equivalent circuit diagram of the MIM device of FIG. 13.

FIG. 16 is a cross section diagram illustrating initial layers being applied in the in the fabrication of MIM device.

FIG. 17 is a cross section diagram illustrating embossing in the fabrication of a MIM device.

FIG. 18 is a cross section diagram illustrating removal of an embossing shim in the fabrication of a MIM device.

FIG. 19 is a cross section diagram illustrating exposing a conductive carrier in the fabrication of a MIM device.

FIG. 20 is a cross section diagram illustrating electro-deposition of a metal in the fabrication of a MIM device.

FIG. 21 is a cross section diagram illustrating selective anodization in the fabrication of MIM device.

FIG. 22 is a cross section diagram illustrating a secondary electro-deposition of a metal in the fabrication of MIM device.

FIG. 23 is a cross section diagram illustrating reduction of a surface layer in the fabrication of MIM device.

FIG. 24 is a cross section diagram illustrating a tertiary electro-deposition of a metal in the fabrication of MIM device.

FIG. 25 is a cross section diagram illustrating lamination of a final substrate in the fabrication of MIM device.

FIG. 26 is a plan view diagram illustrating a MIM device.

FIG. 27 is a cross section diagram illustrating a display configuration with a MIM device.

FIG. 28 is a schematic illustrating an equivalent circuit diagram of the MIM device of FIGS. 26 and 27.

DETAILED DESCRIPTION

Overview

The following discussion is directed to systems and methods for fabricating metal-insulator-metal (MIM) devices for use in active matrix electro-optic displays in particular, but not limited to MIM devices that control liquid crystal cells (LCC) of field-drive displays such as active matrix liquid crystal displays (AMLCD). The MIM devices may be of either single or dual MIM. Fabrication of the MIM devices is performed by material deposition, anodizing of material, and etching away material. Photolithographic processes to fabricate the MIM devices are avoided.

Exemplary AMLCD

Figure 1:
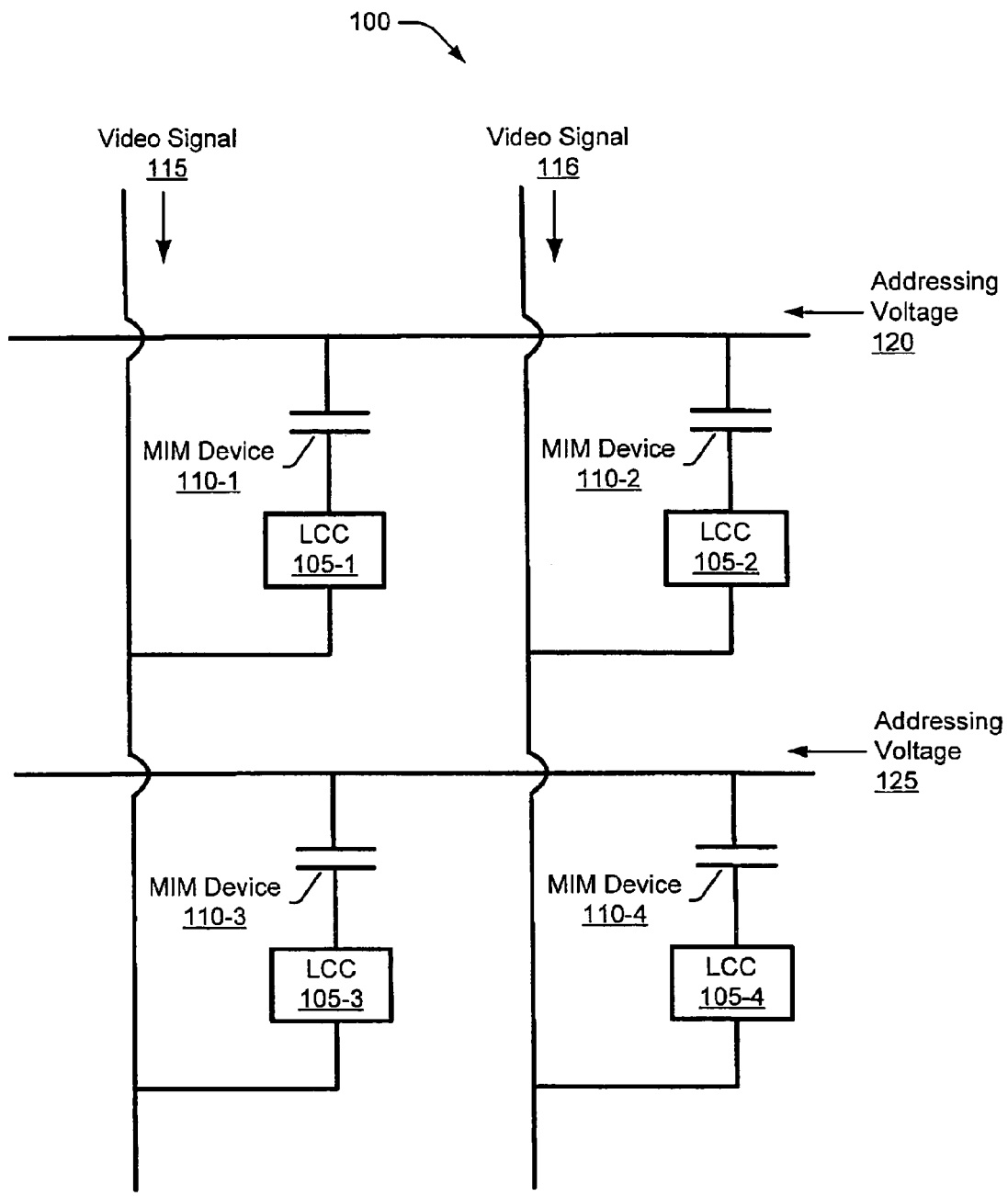
FIG. 1 is a schematic diagram illustrating an exemplary AMLCD of LCCs activated by MIM devices fabricated without the use of photolithography.

FIG. 1 shows an exemplary AMLCD 100. AMLCD 100 includes multiple liquid crystal cells (LCC) that are activated by dedicated MIM devices arranged in a matrix. In this example, LCCs 105-1, 105-2, 105-3, and 105-4 are shown. The activation of LCC 105-1 is controlled by MIM device 110-1; the activation of LCC 105-2 is controlled by MIM device 110-2; the activation of LCC 105-3 is controlled by MIM device 110-3; and the activation of LCC 105-4 is controlled by MIM device 110-4. MIM devices 110-1, 110-1, 110-3, and 110-4 are fabricated using the processes described below.

Although, MIM devices 110-1 to 110-4 are shown as single MIM devices, dual MIM devices illustrated as two capacitive components in anti-series may be used. The choice of a single MIM and a dual MIM device depends on the performance sought by a user.

Video signals 115 and 116 are received by LCCs 105-1 to 105-4. The video signals 115 and 116 may be received in the form of voltage signals. An addressing voltage 120 may be received by MIM devices 110-1 and 110-2. The addressing voltage 120 may be in the form of a square wave representing a "select" or "non-select" condition. When a select condition is received, the line that connects MIM devices 110-1 and 110-2 is considered an addressed line, the MIM devices are biased into conduction and LCCs 105-1 and 105-2 are charged according to the levels on the lines as represented by video signals 115 and 116 giving the desired optical output. At the same time, the addressing voltage 125 is set to "non-select" such that the video signals do not affect the states of LCC 105-3 and 105-4. After that, voltage 120 is set to "non-select" and voltage 125 is set to "select", and the LCCs 105-1 and 105-2 hold their states and LCCs 105-3 and 105-4 receive the video signals corresponding to that line, and so on until the whole matrix is addressed. By controlling the biasing of MIM devices 110-1 to 110-4 through various addressing voltages and providing direct video signals 115 and 116, LCCs 105-1 to 105-4 are controlled and an image is presented on AMLCD 100.

Fabrication—Sputtered Metallization and Ultraviolet Embossing

FIGS. 2 to 15 describe the processes in fabrication of dual MIM devices that may be used as MIM device 110-1 to 110-4 of FIG. 1, where sputter deposition of metal along with UV (ultraviolet) embossing is used. Although dual MIM devices are described, single MIM devices may also be fabricated by modifying the described embossing and metal deposition processes.

Figure 2:
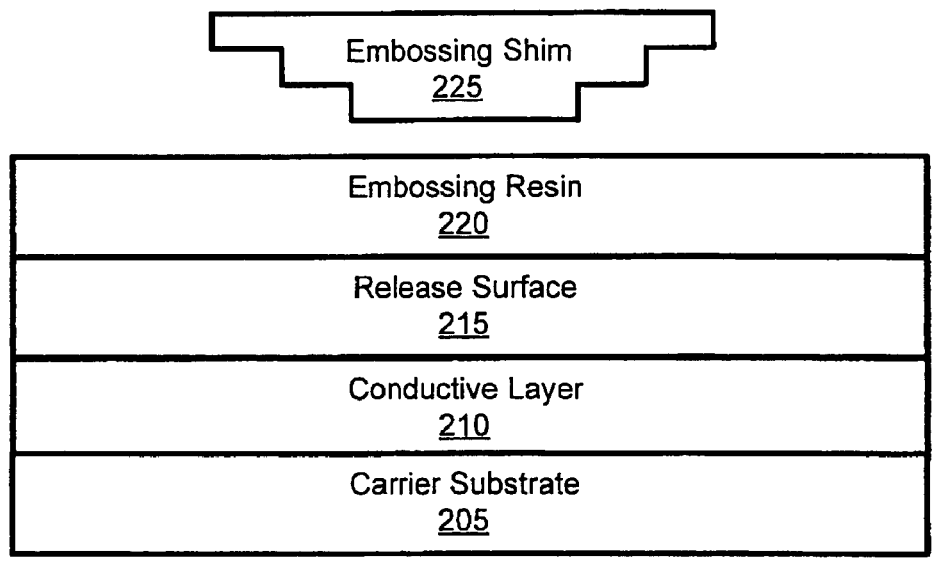
FIGS. 2–15 illustrate exemplary processes in the fabrication of a MIM device or an active addressing element that cause an electro-optic effect (e.g., effect an LCC) using sputtered metallization and ultraviolet embossing.

FIG. 2 shows initial layers (components) being applied. A conductive carrier 205 may be a bulk conductive (e.g. metal plate or sheet), or may be dielectric sheet with a conducting surface layer 210. Copper or nickel with a highly smooth surface finish and high conductivity may be used as conductive carrier 205.

The surface of the metal (i.e., surface conductive layer 210) is treated to form a thin release surface 215. For example, the surface conductive layer 210 may be treated with a 0.1N potassium dichromate aqueous solution for 10 minutes followed by rinsing and drying. The surface conductive layer 210 may also be treated with a surfactant or a monolayer polymer release agent. The thin release surface 215 that is formed is substantially conductive.

An optically transparent UV curable dielectric resin (e.g. Norland Optical Products NOA83H) is coated to form an embossable (i.e., deformable) layer 220. An embossing shim 225 is further provided with a surface relief suitable for the formation of all the features of the addressing lines and MIM devices. The shim 225 is transparent to UV wavelengths.

Figure 3:
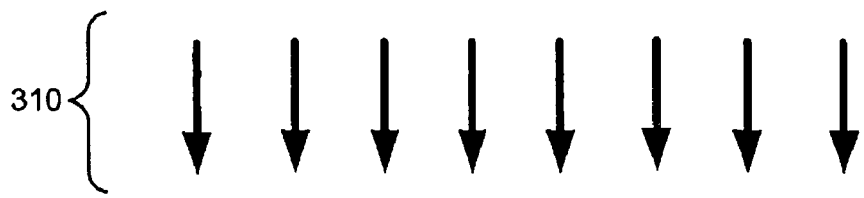
Figure 3:
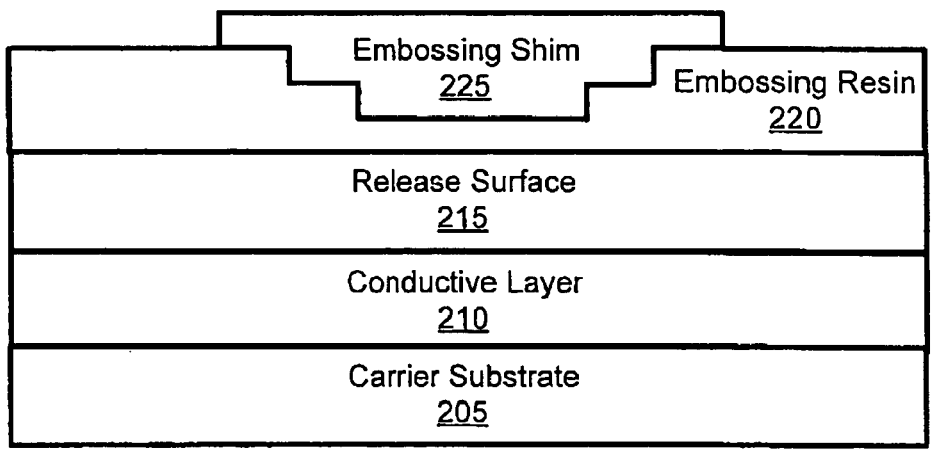

FIG. 3 shows an embossing process. The embossing shim 225 is brought into contact with the embossable resin 220 such that the resin takes up the form of the shim 225, and UV illumination 310 is applied to cure and solidify the embossable resin 220 while the shim 225 is in place.

Figure 4:
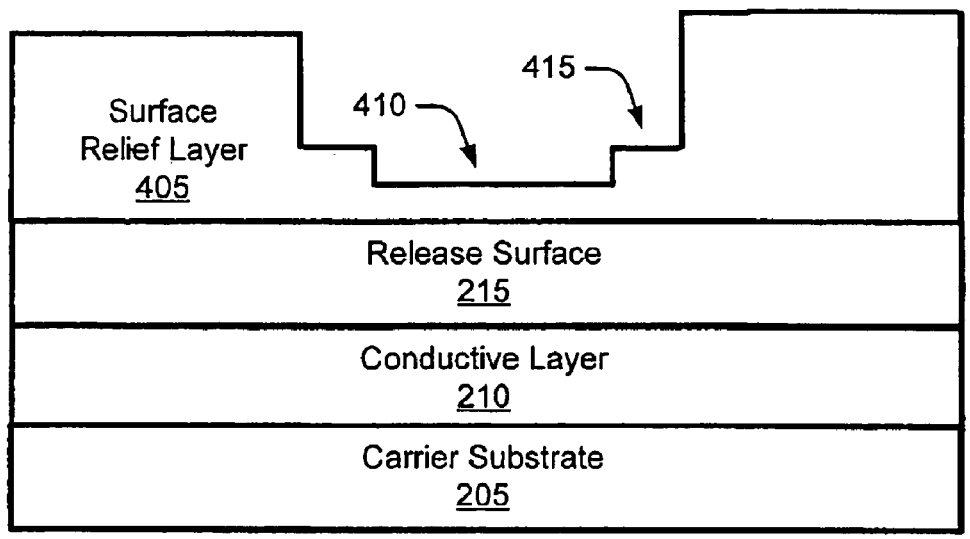

FIG. 4 shows the configuration after embossing. The embossing shim 225 is removed from the embossable resin 220 to leave a cured surface relief layer 405 that includes trenches 410 and 415 at various heights or feature levels.

Figure 5:
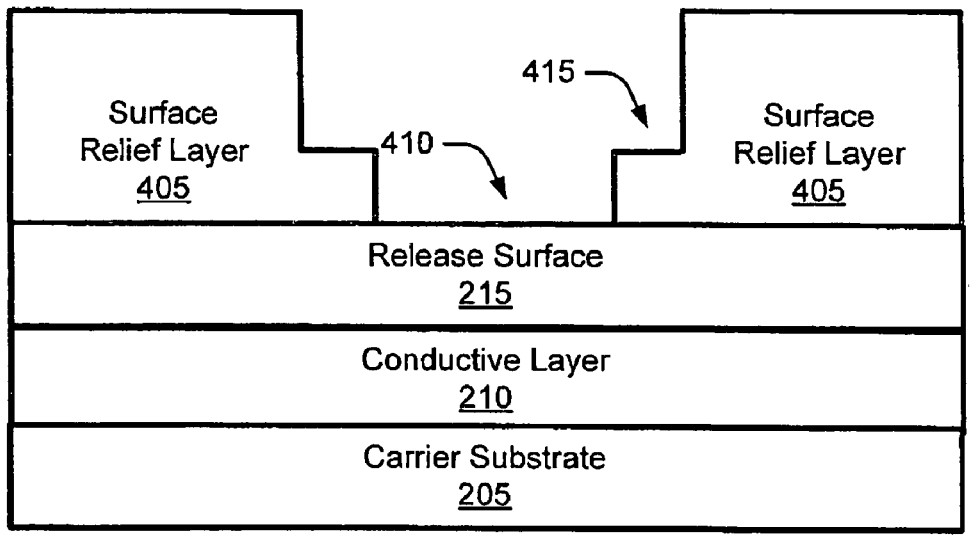

FIG. 5 shows exposing the release surface 215 and by way of conduction the conductive layer 210. A portion of the cured surface relief material 405 is removed. Examples of processes to remove the cured surface relief material 405 include oxygen plasma etch, UV-ozone treatment, and laser ablation. This results in the exposure of the conductive carrier 210 and release surface 215 under the area defined by the trench 410. Should the action of this process also remove or render ineffective the release surface 215, release surface 215 may be re-passivated (i.e., re-applied) at this stage.

Figure 6:
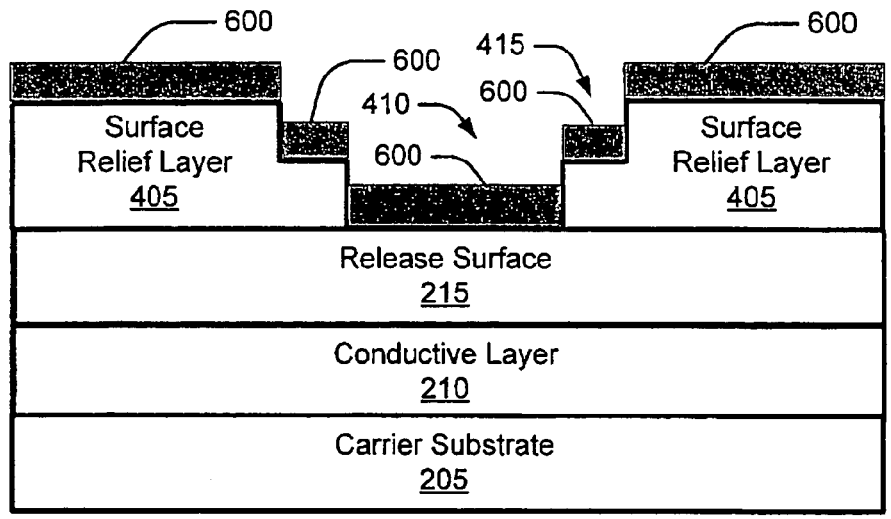

FIG. 6 shows the deposition of a metal. The deposited metal 600 is preferably tantalum (Ta); however, other metals or alloys whose oxides have similar electrical properties to $Ta_2O_5$ may be used, and particularly alloys based on Ta, may be used. An exemplary list of metals that may be anodized includes: Al, Bi, Sb, Nb, Ta, Ag, Cd, Fe, Mg, Sn, W, Zn, Zr, Ti, Cu, and Cr. Also, silicon may be anodized-oxidized. The metal 600 may be deposited using any standard sputtering or evaporation technique under vacuum (i.e., generally a vacuum deposition technique) over the whole of the surface relief structure 405. In particular the metal 600 is deposited over the surfaces 405 and 215, and into the trenches defined by feature levels 410 and 415. The height of the step between 415 and 410 can be adjusted or optimized to minimize deposition on the sidewalls. The deposition method is arranged to be largely anisotropic so that there is little or no material deposited on the sidewalls of the structure. However, any metal that adheres to the sidewalls can be removed by an isotropic wet etch step using a standard metal etchant.

Figure 7:
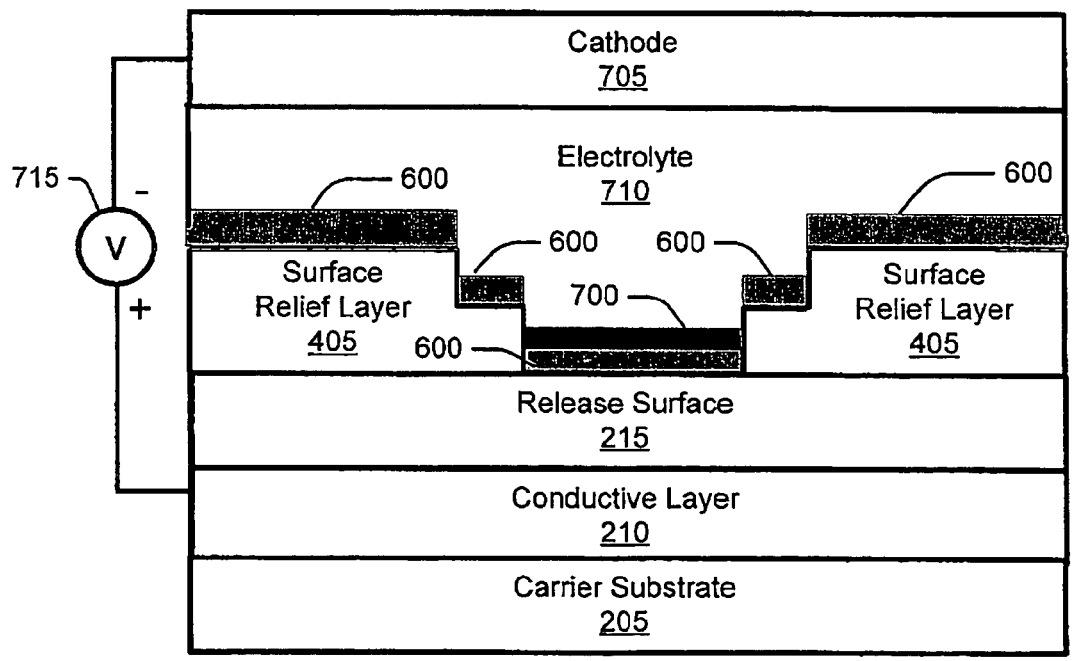

FIG. 7 shows selective anodization. In particular, FIG. 7 shows the selective anodization of the metal (Ta) 600 connected to the release surface 215 and forming $Ta_2O_5$ 700. The anodization is performed in a galvanic cell formed by using the conductive layer 210 as an anode, a cathode 705 of a suitable metal (e.g. platinum) and a suitable electrolyte 710. The electrolyte 710 is preferably a boric acid solution with an approximate pH of 7. Alternatively, a citric acid solution may be used, and surfactants and buffer materials may also be present. Because the only area electrically connected to the anode conductive layer 210 and in contact with the electrolyte 710 is the metal 600 at the bottom of the trench feature 410, only the surface of this metal 600 is converted to the $Ta_2O_5$ 700. The anodization coefficient for Ta is ~1.9 nm/volt, and a starting current density of ~0.2 $mA/cM^2$ is used. The final anodization is performed using a potentiostatic technique where an applied voltage V 715 is constant. The voltage V 715 will determine the thickness of the $Ta_2O_5$ layer and the eventual device threshold.

Figure 8:
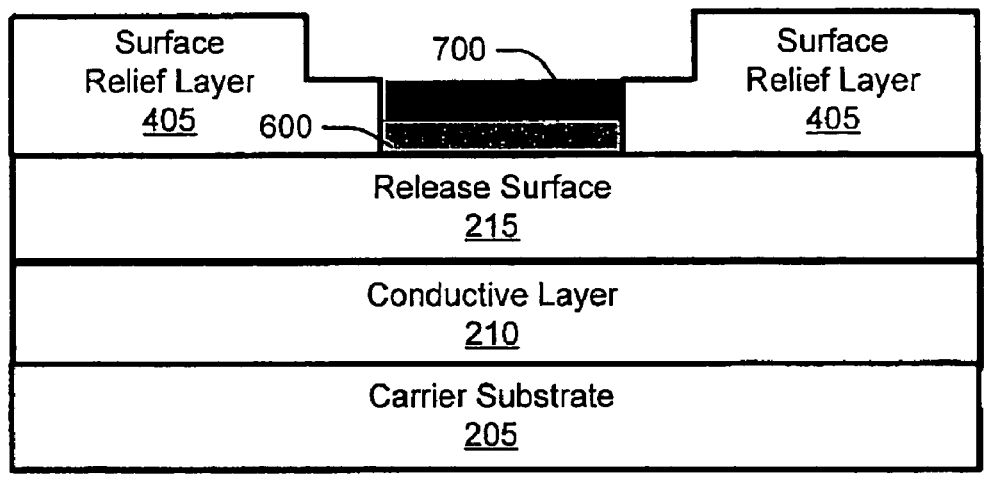

FIG. 8 shows removal of excess metal (i.e., Ta). An etching technique, such as dry plasma etching or wet chemical etch is used with a high selectivity between the Ta 600 and $Ta_2O_5$ 700, such that the thickness and properties of the material formation of the $Ta_2O_5$ film 700 is unaffected by this process.

Figure 9:
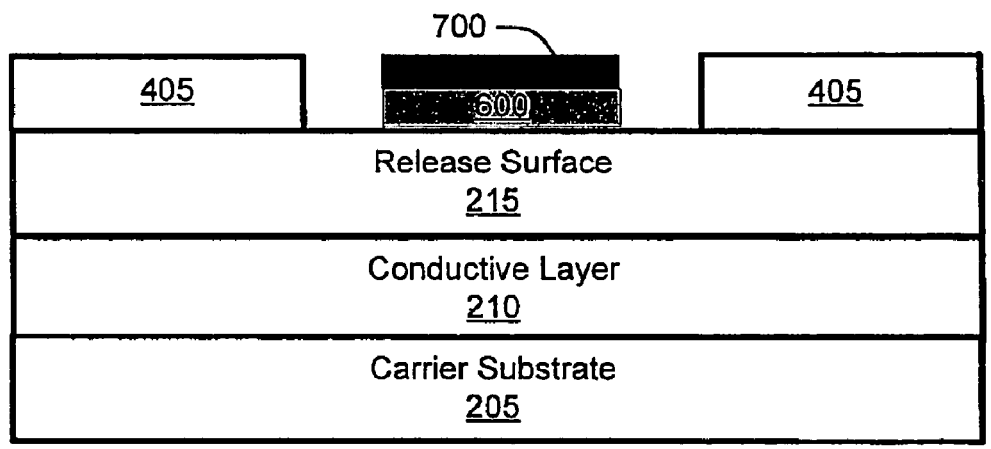

FIG. 9 shows reducing the surface layer 405 thickness. The whole of the surface relief layer 405 is reduced by enough material to uncover the release surface 215 located under the second level surface features (i.e., as defined by feature 415). The etching is accomplished by known techniques such as dry plasma etching, UV-ozone etching, or direct laser ablation. Should the surface release layer 215 be removed or rendered ineffective by this process, release surface 215 may be re-passivated (i.e., re-applied) at this stage.

Figure 10:
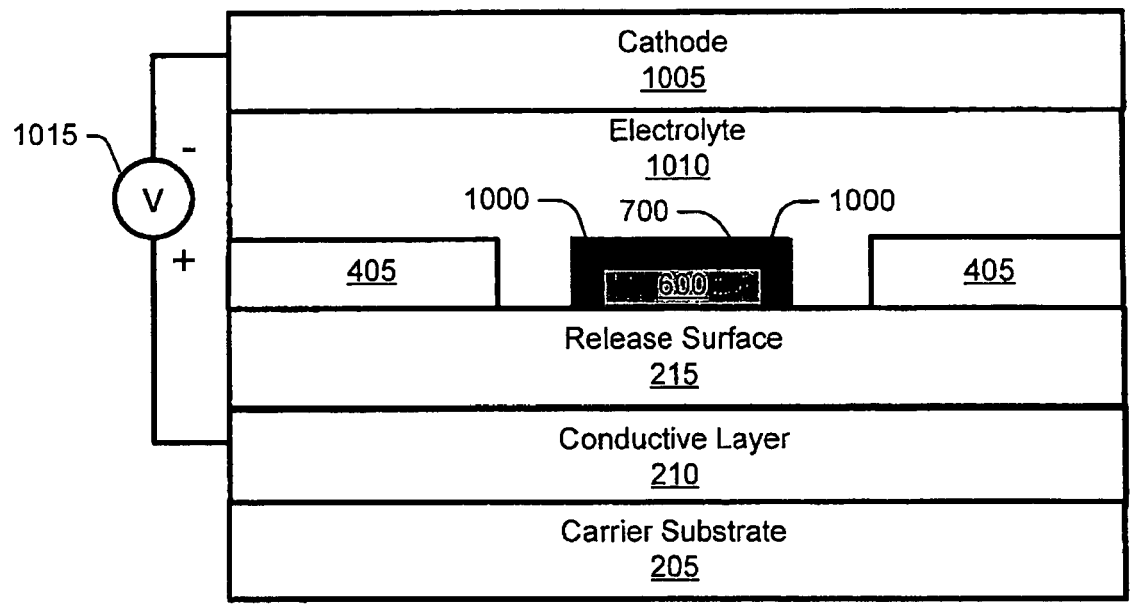

FIG. 10 shows a secondary anodization. A similar process as described in FIG. 7 is performed in anodizing the sidewalls of the metal 600 to form $Ta_2O_5$ 1000. In particular a galvanic cell formed by using the conductive surface 215 as an anode, a cathode 1005 of a suitable metal (e.g., platinum) and a suitable electrolyte 1010. An applied voltage V 1015 determines the thickness of the $Ta_2O_5$ 1000 layer.

Together with the $Ta_2O_5$ layer 700, the $Ta_2O_5$ 1000 forms a complete layer of $Ta_2O_5$ over the metal 600. Further heating, by thermal chamber or localized laser absorption, is performed to anneal the $Ta_2O_5$ 700 and 1000 to give the desired electrical characteristics.

Figure 11:
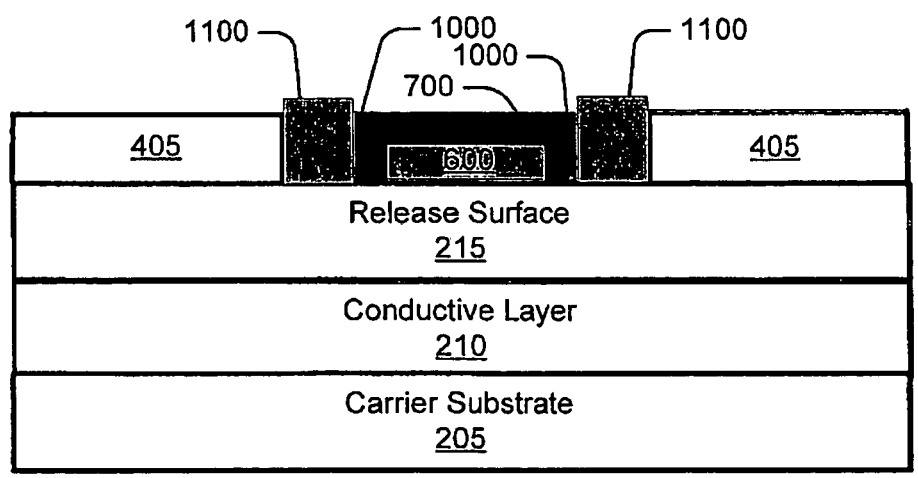

FIG. 11 shows a secondary metal deposition. A metal 1100 is deposited. Preferably an electro-deposition (e.g., electroplating) technique is used. A deposition potential is chosen to ensure that the $Ta_2O_5$ layer 1000 is not biased into conduction, such that the metal 1100 is deposited only into the channels as shown in FIG. 9 formed by the secondary level surface relief (i.e., as defined by trench 415). These channels form the addressing lines (i.e., addressing lines 120 of FIG. 1) and contact to the LCC pixel electrode as further described below. The addressing lines may also be referred to as a bus bar or bus lines. The metal 1100 is chosen to provide electrical conductivity, a suitable interface to the $Ta_2O_5$ layers 700 and 1000, and to permit electro-deposition. Examples of metal 1100 include nickel, aluminum, copper and silver. Thin deposits of metal that are inadvertently formed over the $Ta_2O_5$ 1000 may be removed by a short etch using dry plasma or wet etchant techniques.

Figure 12:
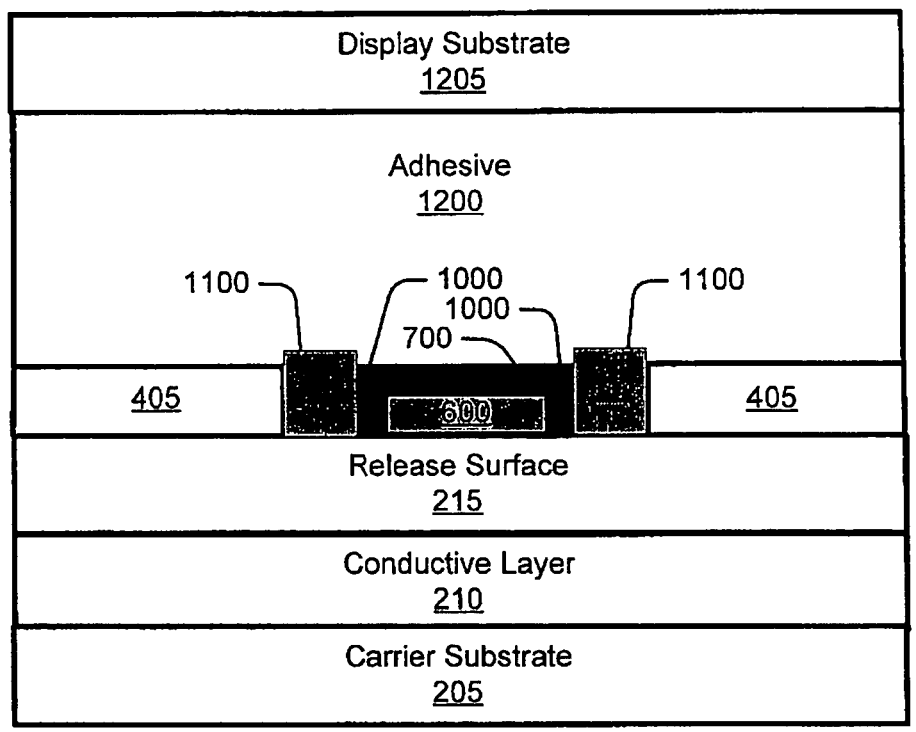

FIG. 12 shows lamination of the final substrate. An adhesive layer 1200 is coated onto the circuit as defined by surface layer 405, metal 1100, and the $Ta_2O_5$ layers 700 and 1000. The thickness of the adhesive layer 1200 is preferably between 5 and 20 microns. Suitable adhesive materials include "NOA81" from Norland Optical Products. A display substrate 1205 is applied to adhesive layer 1200. Display substrate 1205 may be glass, flexible plastic or other material. Display substrate 1205 may be between 50 and 2000 microns.

After the adhesive layer 1200 has attained a suitable adhesion to the display substrate 1205 and the circuit as defined by surface layer 405, metal 1100, and the Ta 600, the $Ta_2O_5$ layers 700 and 1000, the carrier substrate 205, with conductive layer 210 and release surface 215 may be removed by mechanical peeling (i.e., separation). The adhesion and peel strengths of the various interfaces are such that the separation occurs preferentially at the release surface 215. The Ta 600, $Ta_2O_5$ 1000, and secondary metal 1100 are exposed. Further anodizing of the Ta 600 may be performed to prevent addressing short circuits between the addressing line metal and the LCC contact metal as shown below. The carrier substrate 205 may be discarded, or preferentially cleaned and reused to minimize material wastage.

Figure 13:
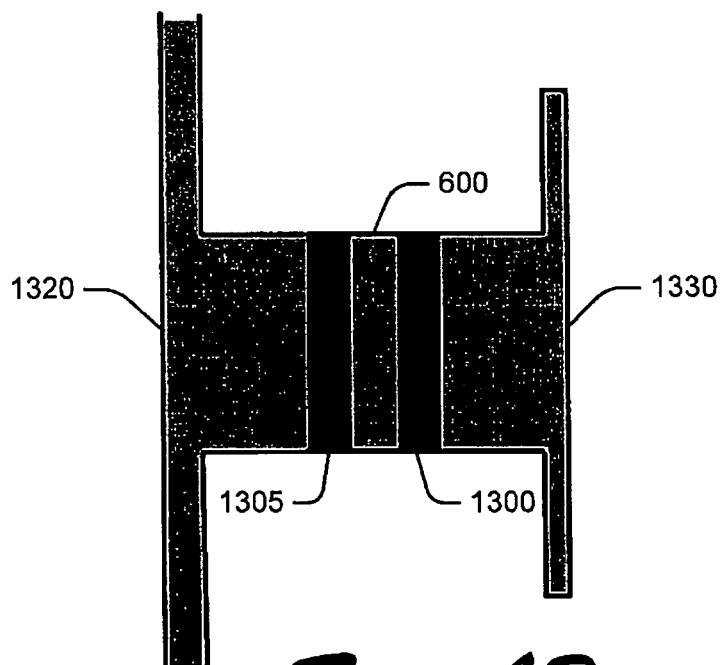

FIG. 13 shows a plan view of the completed device, showing the addressing line 1320 (i.e., metal 1100) corresponding to the schematic addressing lines 120 of FIG. 1, and the LCC electrode connection 1330 (i.e., metal 1100). The $Ta_2O_5$ regions 1300 and 1305 represent the sub-regions of the $Ta_2O_5$ layer 1000 in contact with metal regions 1320 (i.e., metal 1100) and 1330 (i.e., metal 1100) respectively.

Figure 14:
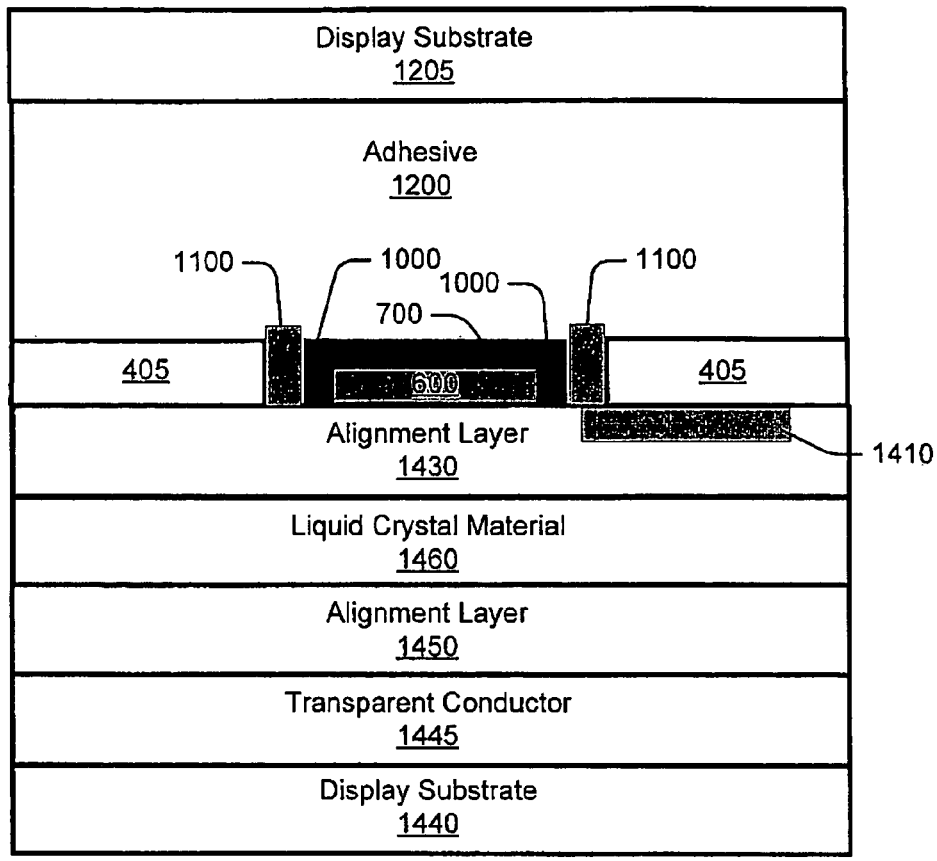

FIG. 14 shows a final display construction. To provide an electrode to activate the liquid crystal cell (LCC), and to define the pixel area, a transparent-conductive material is used to connect one side of the dual MIM structure to the LCC. The transparent conductive material is coated and patterned to form LCC electrode 1410, and may be of any known material with suitable properties. Preferably a doped polyethylenedioxythiophene dispersion is used, and is known as PEDOT or PDOT available as Baytron "P" from Bayer Chemicals. The PEDOT electrode 1410 may be patterned using lithographic techniques such as laser ablation.

To effect the correct alignment of the liquid crystal and LCC geometry any of many known alignment layers, barrier layers and other treatments may be applied to this substrate, represented collectively as alignment layer 1430. A second display substrate 1440 is also prepared. Display substrate 1440 contains simple transparent electrode patterning and may be fabricated by any known technique. Preferably a similar addressing line (i.e., bus bar) definition, metalization, transfer and transparent conductive material coating and patterning technique is used as outlined above, without the deposition and conversion of Ta or similar metals, to form a second LCC connection transparent conductor 1445. The second display substrate 1440 also affords an alignment layer compatible with the desired liquid crystal electro-optical mode, shown as alignment layer 1450. To complete the display a liquid crystal material 1460 is introduced into the cell. Other structures and materials relating to the construction and preparation of a complete display system are not shown, but are well known in the art.

Figure 15:
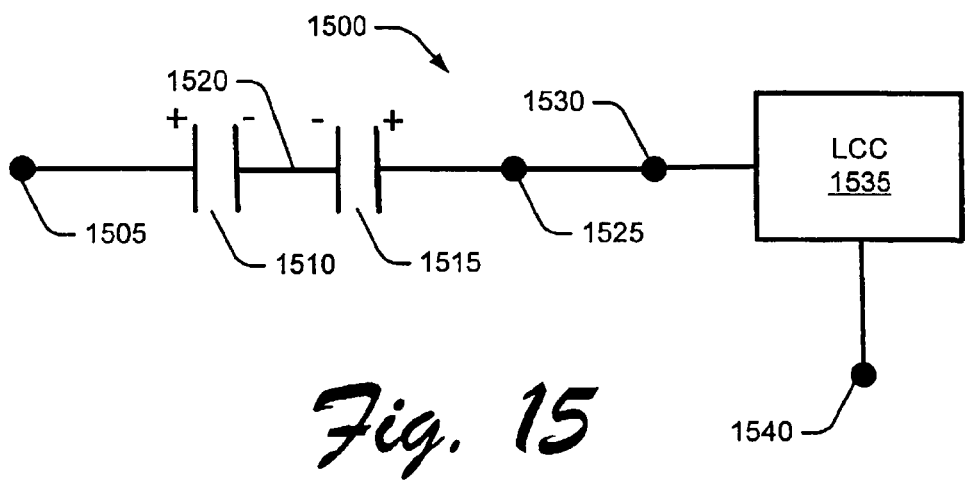

FIG. 15 shows an equivalent circuit 1500 of the dual MIM device shown in FIG. 13. Circuit 1500 includes a connector 1505 which represents bus-bar or addressing line 1320 (i.e., metal 1100) of FIG. 13. Bus-bar 1505 receives an addressing voltage such as addressing voltage 120 as shown in FIG. 1. Connector 1505 is coupled to a first MIM element depicted by the capacitive component 1510, the dielectric of which represents $Ta_2O_5$ layer 1305. A second MIM element is depicted by the capacitive component 1515, the dielectric of which represents $Ta_2O_5$ layer 1300. Capacitive components 1510 and 1515 are particularly coupled to be in an "anti-series" arrangement such that the plates of the same asymmetric polarity, if any, are coupled to one another. In this example the plates indicated by a negative bias asymmetric polarity are connected together. Capacitive components 1510 and 1515 are connected together by a connector 1520 which represents the Ta 600 of FIG. 13. Capacitive component 1515 is coupled to a connector 1525 which represents the electrode contact 1330. Connector 1525 is coupled to a further connector 1530 which represents the transparent electrode 1410. Connector 1530 is coupled to an LCC 1535 such as LCC formed by layers 1430, 1450 and 1460 in FIG. 14. LCC 1535 is coupled to a final connector 1540 which represents the transparent electrode 1445 which receives a video signal such as video signal 115 of FIG. 1.

Fabrication—Electro-deposited Metallization

FIGS. 16 to 28 describe the processes in fabrication dual MIM devices that may be used as MIM device 110-1 to 110-4 of FIG. 1, where only electro-deposition of metals is used, which reduces material waste and allows atmospheric pressure processing. Although dual MIM devices are described, single MIM devices may also be fabricated by modifying the described embossing and metal deposition processes.

Figure 16:
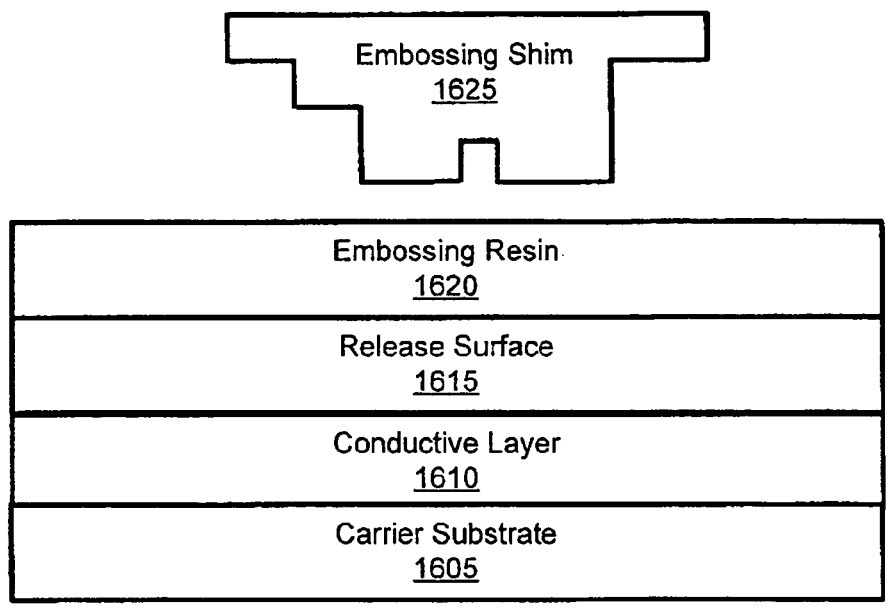
FIGS. 16–28 illustrate exemplary processes in the fabrication a MIM device or an active addressing element that cause an electro-optic effect (e.g., effect an LCC) using electro-deposited metallization, anodizing, and ultraviolet embossing.

FIG. 16 shows initial layers (components) being applied. A conductive carrier 1605 may be a bulk conductive (e.g. metal plate or sheet), or may be dielectric sheet with a conducting surface layer 1610. Copper or nickel with a highly smooth surface finish and high conductivity may be used as conductive carrier 1605.

The surface of the metal (i.e., surface conductive layer 1610) is treated to form an oxide release surface 1615. For example, the surface conductive layer 1610 may be treated with a 0.1N potassium dichromate aqueous solution for 10 minutes followed by rinsing and drying. The surface conductive layer 1610 may also be treated with a surfactant or known monolayer polymer release agent. A thin release layer 1615 is formed that is substantially conductive.

An optically transparent UV curable dielectric resin (e.g., Norland Optical Products NOA83H) is coated to form an embossable (i.e., deformable) layer 1620. An embossing shim 1625 is further provided with a surface relief suitable for the formation of all the features of the addressing lines and MIM devices, characterized by the presence of more than two height levels. The shim 1625 is transparent to UV wavelengths.

Figure 17:
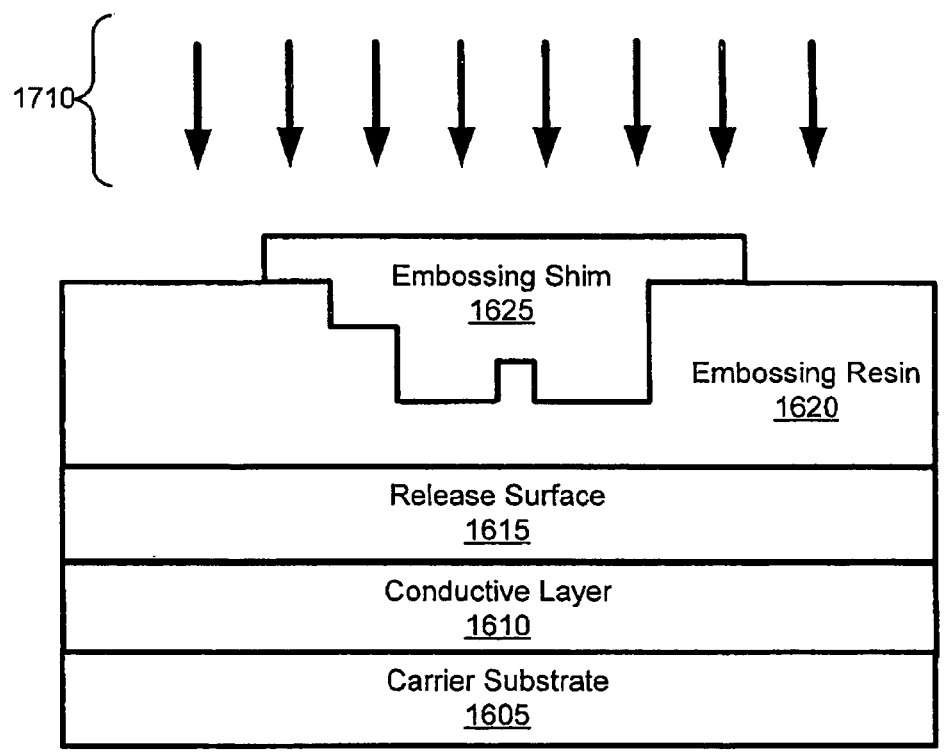

FIG. 17 shows an embossing process. The embossing shim 1625 is brought into contact with the embossable resin 1620 such that the resin 1620 takes up the form of the shim 1625, and UV illumination 1710 is applied to cure and solidify the embossable resin 1620 while the shim 1625 is in place.

Figure 18:
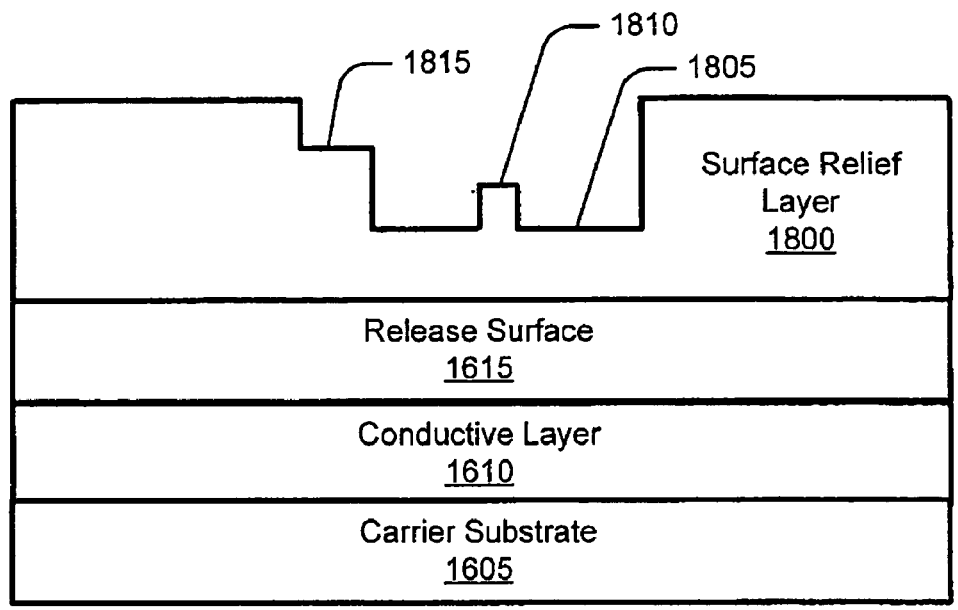

FIG. 18 shows the configuration after embossing. The embossing shim 1625 is removed from the embossable resin 1620 to leave a cured surface relief layer 1800 having trenches 1805, 1810, and 1815 at various heights or feature levels.

Figure 19:
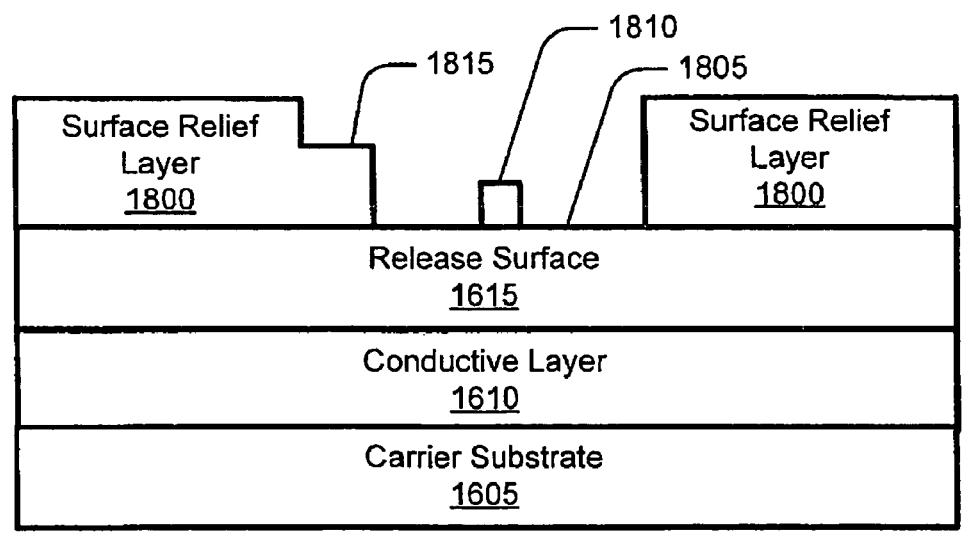

FIG. 19 shows exposing release surface 1615 and by way of conduction the conductive layer 1610. A portion of the cured surface relief material 1800 is removed. Examples of processes to remove the cured surface relief material 1800 include direct laser ablation or UV-ozone treatment carried out at atmospheric pressure, so as to expose the conductive carrier 1610 and release surface 1615 under the area defined by the trench feature 1805. Secondary feature level 1810 and tertiary feature level 1815 are not completely removed at this stage. Should the action of this removal process also remove or render ineffective the release surface 1615, release surface 1615 may be re-passivated (i.e., re-applied) at this stage.

Figure 20:
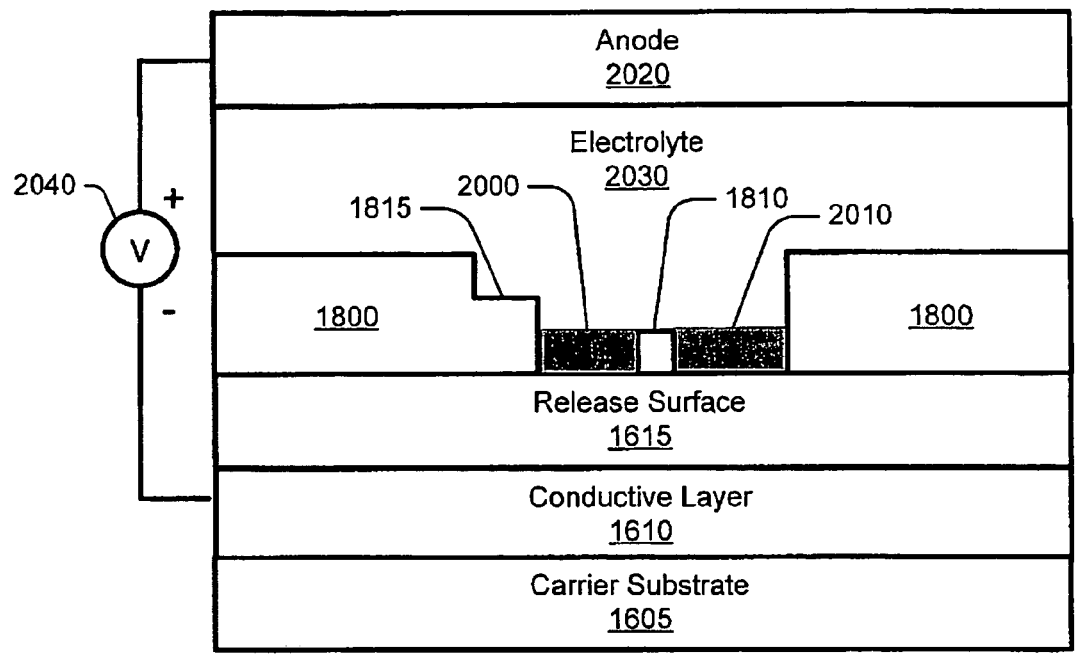

FIG. 20 shows electro-deposition of a metal. The metal deposited in regions 2000 and 2010 is preferably tantalum (Ta); however, other metals or alloys which have oxides with similar electrical properties to $Ta_2O_5$, and particularly alloys based on Ta, may be used. An exemplary list of metals includes: Al, Bi, Sb, Nb, Ta, Ag, Cd, Fe, Mg, Sn, W, Zn, Zr, Ti, Cu, and Cr. The metal 2000 and 2010 is electro-deposited by forming a galvanic cell comprising of the conductive layer 1610 as cathode, an inert anode 2020 such as platinum, and a suitable electrolyte 2030. A voltage 2040 is applied at conductive carrier surface 1610 and anode 2020. A low temperature molten salt electrolyte 2030 is preferred, where the electrolyte 2030 may be e.g. a mixture of $TaCl_5$ and 1-methyl-3-ethlyimidazolium chloride. The deposition of metal (i.e., Ta) 2000, 2010 is confined to the areas defined initially by features 1805, and the thickness of the deposit is limited to form a layer similar but no higher than the secondary embossing features 1810, forming a dielectric wall between the two areas of deposited metal 2000 and 2010. Alternatively, a combination of metals or alloys may be electro-deposited, with a thicker layer of an easily processed metal, such as nickel or copper, followed by a thin layer of tantalum in order to increase the conductivity and height of the features, without compromising the surface material characteristics.

Figure 21:
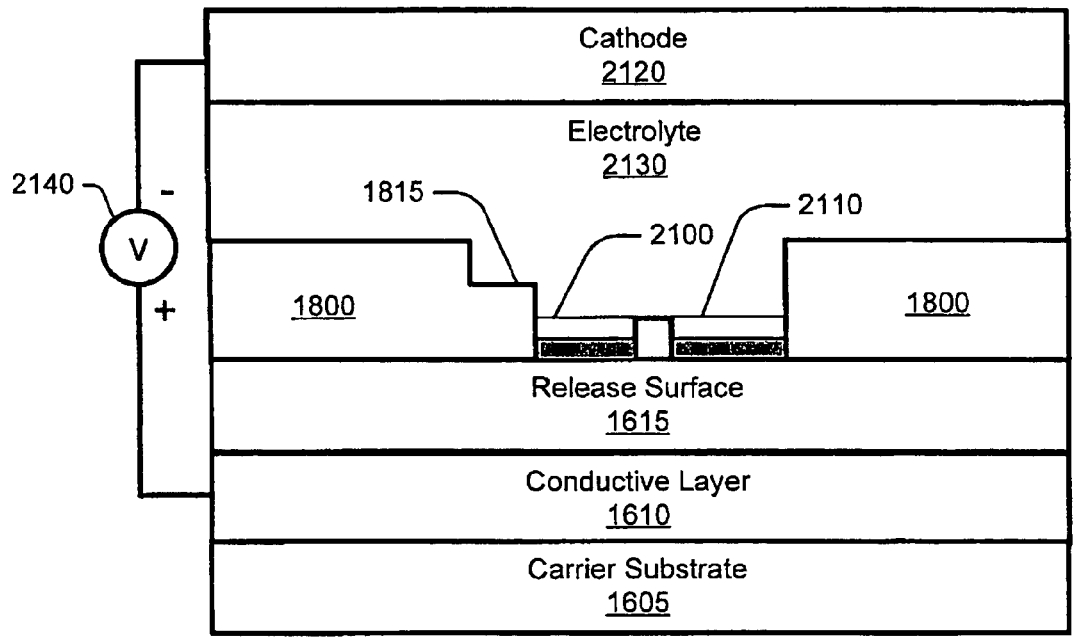

FIG. 21 shows selective anodization. The selective anodization is performed on Ta 2000 and 2010 to form $Ta_2O_5$ 2100 and 2110. Anodization is performed in a galvanic cell formed by using the conductive layer 1610 as an anode, a cathode 2120 of a suitable metal (e.g., platinum) and a suitable electrolyte 2130. The electrolyte 2130 is preferably a boric acid solution with an approximate pH of 7. Alternatively, a citric acid solution may be used, and surfactants and buffer materials may also be present. The anodization coefficient for Ta is ~1.9 nm/volt, and a starting current density of ~0.2 $mA/cm^2$ is used. The final anodization is performed using a potentiostatic technique where an applied voltage V 2140 is held constant. Applied voltage 2140 determines the thickness of the $Ta_2O_5$ layer and the eventual device threshold.

Figure 22:
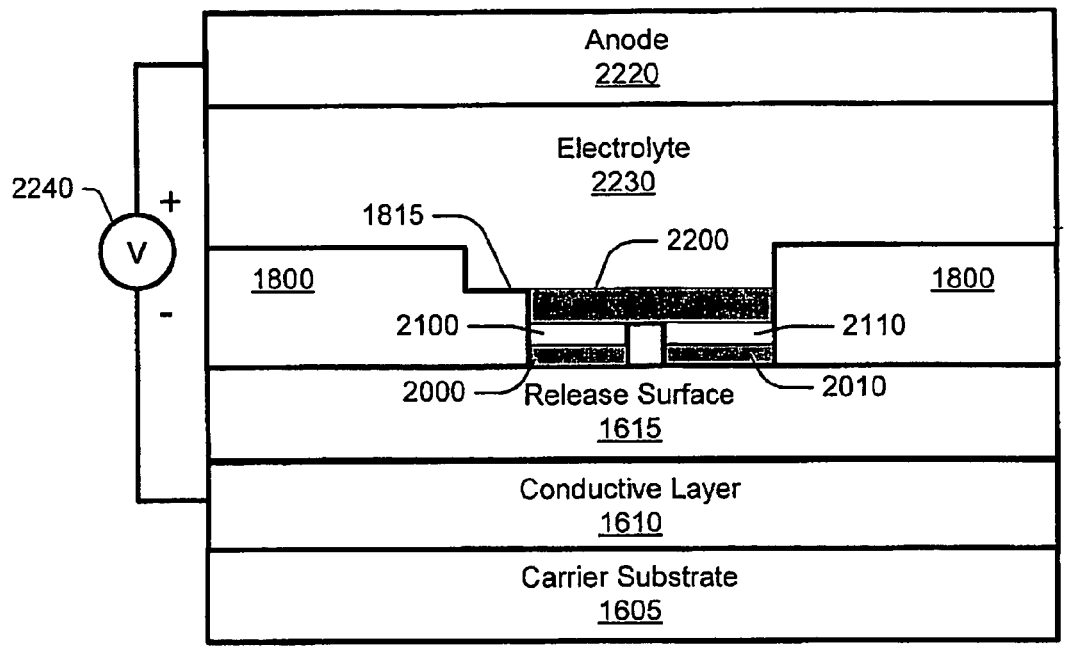

FIG. 22 shows a secondary metal deposition. A contact metal 2200 is deposited by electro-deposition. Collectively the following are treated as a cathode: the conductive layer 1610, the previously deposited metal or Ta 2000 and 2010, and $Ta_2O_5$ 2100 and 2110. Further provided is an anode 2220 of suitable metal (e.g., platinum or nickel) and an electrolyte 2230. By the control of additives in the electrolyte 2230, and adjusting an applied voltage 2240 the isotropy of the deposition can be controlled to form a layer bridging between the areas of $Ta_2O_5$ 2100 and 2110. The electro-deposition of metal 2200 over the dielectric $Ta_2O_5$ is achieved by raising the potential beyond the threshold voltage of the dielectric layer. Metal 2200 provides a contact region between the two MIM elements and forms a dual MIM structure.

Figure 23:
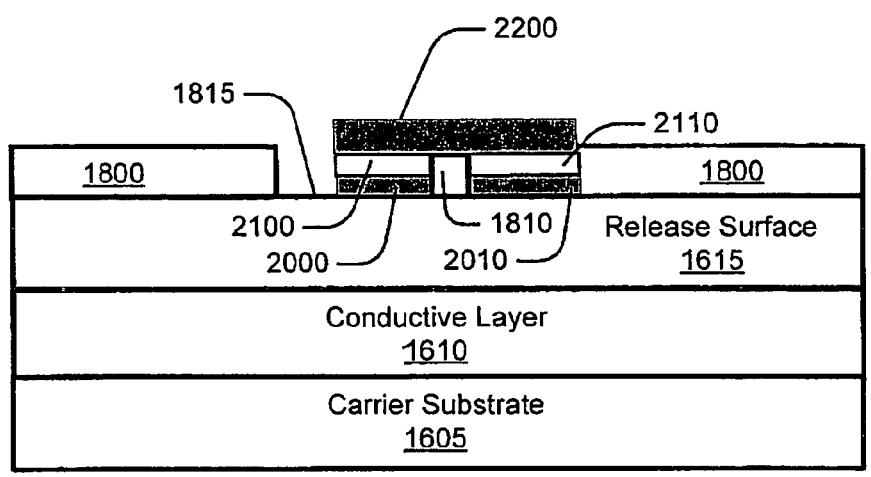

FIG. 23 shows a reduction of the surface layer 1800. A portion of the cured surface relief material 1800 is removed by known techniques of removing polymer materials, for example by direct laser ablation or UV-ozone treatment carried out at atmospheric pressure. Conductive carrier layer 1610 and release surface 1615 are exposed at the tertiary level trench 1815. Should the release surface 1615 be removed or rendered ineffective by this removal process, the release surface 1615 may be re-passivated (i.e., re-applied) at this stage.

Figure 24:
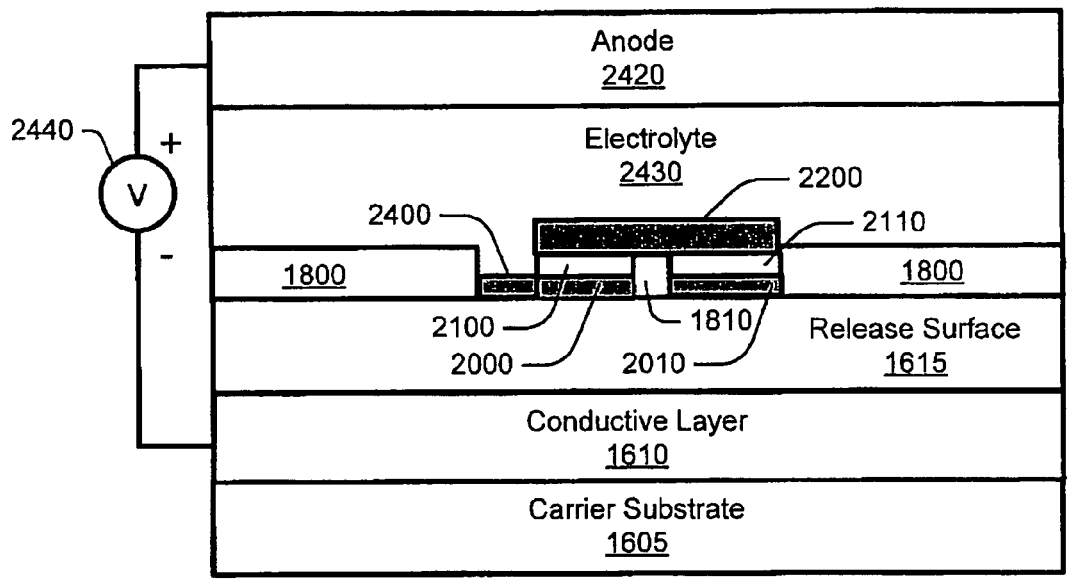

FIG. 24 shows a tertiary metal electro-deposition. A further electro-deposition forms a metal conductor 2400. Metal 2400 is used as the addressing structures or lines 120 shown in FIG. 1. Collectively the conductive layer 1610 and the side thickness region of the previously deposited metal or Ta 2000 form the cathode. Further an anode 2420 and electrolyte 2430 are provided. A reduced potential voltage 2440 is used to ensure that the deposition of metal 2400 only takes place in the region defined originally by the trench feature 1815. Due to the presence of dielectric 2100 and 2110, no further deposition occurs on the secondary contact metal 2200. The thickness of the deposited conductors 2400 is such that the level of metal 2400 is below the height of the primary metal deposition 2000 and 2010 and dielectric layers 2100 and 110. An ohmic contact is provided between the tertiary metal 2400 to the primary metal 2000.

Figure 25:
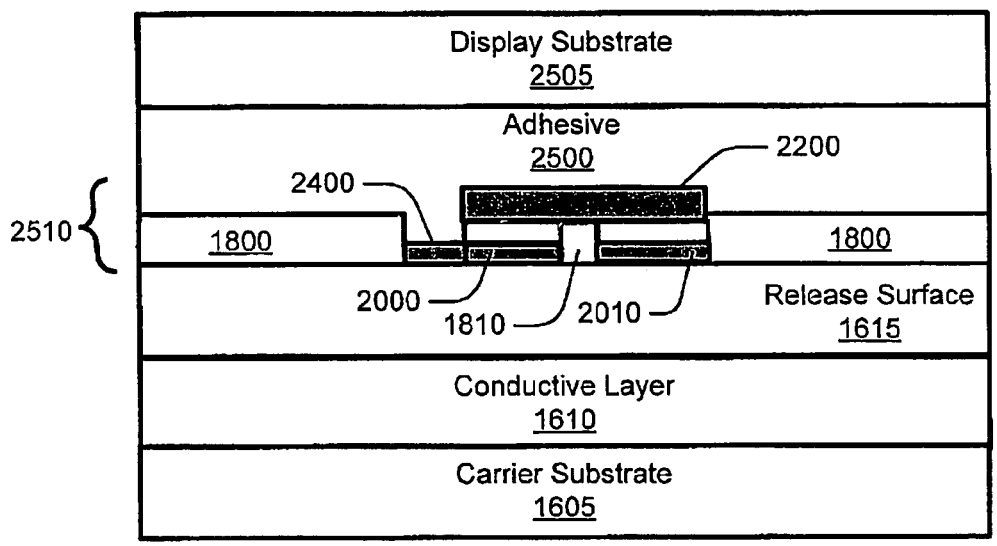

FIG. 25 shows a lamination of the final substrate. An adhesive layer 2500 is coated onto the circuit as defined by surface layer 1800, metal 2400, and metal 2200. The thickness of the adhesive layer 2500 is preferably between 5 and 20 microns. Suitable adhesive materials include "NOA81" from Norland Optical Products. A display substrate 2505 is applied to adhesive layer 2500. Display substrate 2505 may be glass, flexible plastic or other material. Display substrate 2505 may be between 50 and 2000 microns.

After the adhesive layer 2500 has attained a suitable adhesion to the display substrate 2505 and a circuit 2510, the conductive carrier 1605, with conductive layer 1610 and release surface 1615 may be removed by mechanical peeling (i.e., separation). Circuit 2510 includes and is defined by 1800, 1810, 2000, 2010, and 2200. The adhesion and peel strengths of the various interfaces are so engineered such that the separation occurs at the release surface 1615. The Ta 2000 and 2010, and tertiary metal 2400 are exposed.

Figure 26:
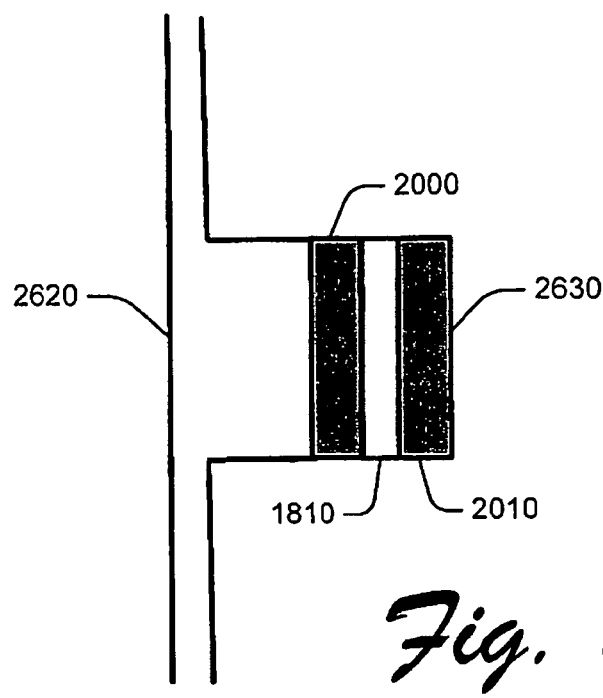

FIG. 26 shows a plan view of the completed device, showing addressing line 2620 (i.e., metal 2400) corresponding to schematic addressing lines 120 of FIG. 1, and LCC electrode connection 2630 (i.e., metal 2010).

Figure 27:
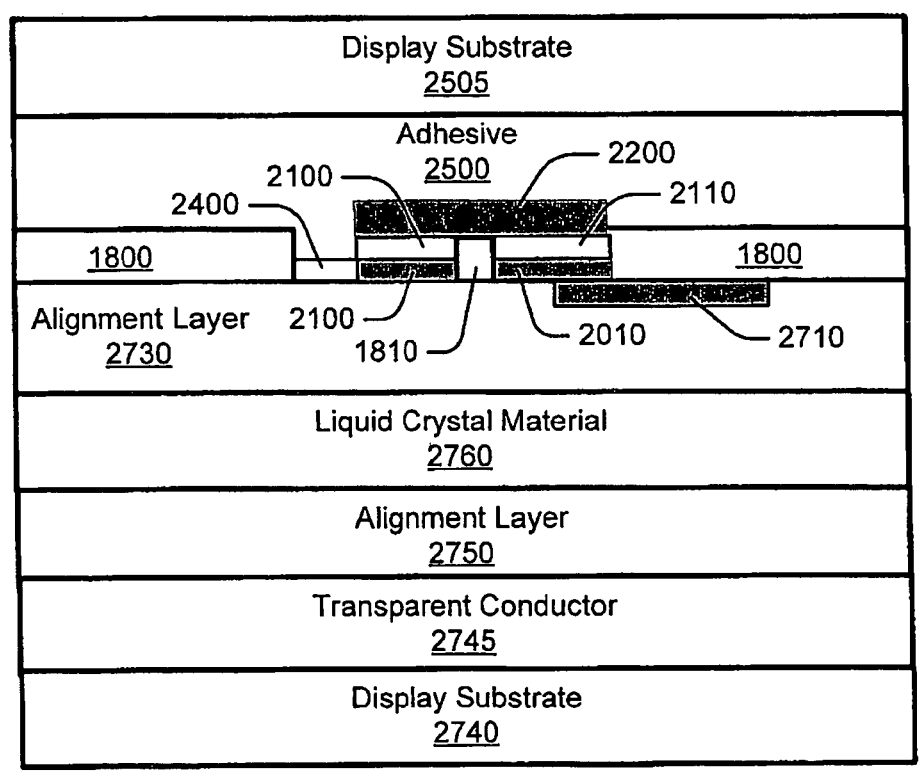

FIG. 27 shows a final display construction. To provide an electrode to activate a liquid crystal cell (LCC), and to define the pixel area, a transparent conductive material is used to connect one side of the dual MIM structure to the LCC. The transparent conductive material is coated and patterned to form an LCC electrode 2710, and may be formed of any known material with suitable properties. Preferably a doped polyethylenedioxythiophene dispersion is used, and is known as PEDOT or PDOT available as Baytron "P" from Bayer Chemicals. The PEDOT electrode 2710 may be patterned using known lithographic techniques such as laser ablation.

To effect the correct alignment of the liquid crystal and LCC geometry any of many known alignment layers, barrier layers and other treatments may now be applied to this substrate, these represented collectively as alignment layer 2730. A second display substrate 2740 is also prepared. Display substrate 2740 contains simple transparent electrode patterning and may be fabricated by any known technique. Preferably a similar addressing line or bus bar definition, metalization, transfer and transparent conductive material coating and patterning technique is used as outlined above, without the deposition and conversion of Ta or similar metals, to form the second LCC connection 2745. The second display substrate 2740 also affords an alignment layer compatible with the desired liquid crystal electro-optical mode, shown as alignment layer 2750. To complete the display a liquid crystal material 2760 is introduced into the cell. Other structures and materials relating to the construction and preparation of a complete display system are not shown, but are well known in the art.

Figure 28:
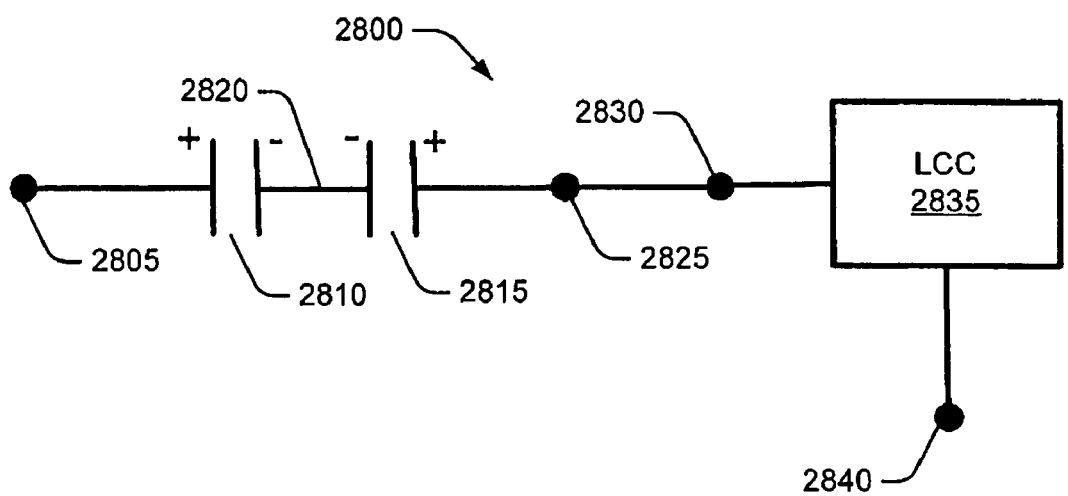

FIG. 28 shows an equivalent circuit 2800 of the dual MIM device shown in FIGS. 26 and 27. Circuit 2800 includes a connector 2805 which represents bus-bar or addressing line 2620 of FIG. 26. Bus-bar 2805 receives an addressing voltage such as addressing voltage on the address lines 120 of FIG. 1. Connector 2805 is coupled to a first MIM element depicted by the capacitive component 2810, the dielectric of which represents $Ta_2O_5$ layer 2100. A second MIM element is depicted by the capacitive component 2815, the dielectric of which represents $Ta_2O_5$ layer 2110. Capacitive components 2810 and 2815 are particularly coupled to be in an "anti-series" arrangement such that the plates of the same asymmetric polarity are coupled to one another. In this example the plates indicated by a negative bias asymmetric polarity are connected together. Capacitive components 2810 and 2815 are connected together by a connector 2820 which represents the secondary metal contact 2200 of FIG. 22. Capacitive component 2815 is coupled to a connector 2825 which represents the electrode contact 2010. Connector 2825 is coupled to a further connector 2830 which represents the transparent electrode 2710. Connector 2830 is coupled to an LCC 2835 such as LCC formed by layers 2730, 2750 and 2760 in FIG. 27. LCC 2835 is coupled to a final connector 2840 which represents the transparent electrode 2745 which receives a video signal such as video signal 115 of FIG. 1.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

The invention claimed is:

1. A device, comprising:
a first non-linear capacitive element comprised of a first anodized dielectric;
an addressing line formed by a first metal that contacts to the first nonlinear capacitive element;
a second non-linear capacitive element comprised of a second anodized dielectric;
an electro-optic effect contact formed by a second metal that contacts to the second non-linear capacitive element;
a dielectric member positioned between and contacting the first anodized dielectric and the second anodized dielectric; and
a third metal contacting the first anodized dielectric and the second anodized dielectric.

2. The device of claim 1 wherein the electrooptic effect is applied to a liquid crystal cell.

3. The device of claim 1 wherein the device comprises a dual metal-insulator-metal (MIM) device.

4. The device of claim 1 wherein the first anodized dielectric and the second anodized dielectric is include $Ta_2O_5$.

5. The device of claim 1 wherein the first metal, the second metal and the third metal include one or more of tantalum, niobium, titanium, copper, aluminum, or silver.

6. The device of claim 1 wherein the first metal, the second metal, and the third metal comprise alloys.

7. The device of claim 1, wherein:
the dielectric member includes a UV curable resin.

8. The device of claim 1, wherein:
the dielectric member is formed by embossing.

9. The device of claim 1, wherein:
the third metal contacts the dielectric member.

* * * * *

UNITED STATES PATENT AND TRADEMARK OFFICE
CERTIFICATE OF CORRECTION

PATENT NO.         : 7,042,057 B2                                                           Page 1 of 1
APPLICATION NO. : 11/122910
DATED              : May 9, 2006
INVENTOR(S)        : Weng et al.

It is certified that error appears in the above-identified patent and that said Letters Patent is hereby corrected as shown below:

In the Claims

Col. 12 (line 8), after "dielectric", delete "is".

Signed and Sealed this

Twenty-seventh Day of February, 2007

JON W. DUDAS
*Director of the United States Patent and Trademark Office*